United States Patent [19]

Bremenour et al.

[11] 4,138,711
[45] Feb. 6, 1979

[54] STATIC CONTROL DEVICE FOR PRINTED CIRCUIT PACKAGE

[75] Inventors: Edwin L. Bremenour, Euclid; Timothy E. McAdams, Willowick; Clifford A. Rhodes, Willoughby, all of Ohio

[73] Assignee: Allen-Bradley Company, Milwaukee, Wis.

[21] Appl. No.: 838,172

[22] Filed: Sep. 29, 1977

[51] Int. Cl.² .............................................. H05K 5/00
[52] U.S. Cl. .................................. 361/424; 200/51.1; 361/399
[58] Field of Search ............... 361/399, 395, 405, 424; 339/19; 200/51.1, 51.11, 51.12; 206/328, 331, 334

[56] References Cited

U.S. PATENT DOCUMENTS

| | | | |
|---|---|---|---|
| 3,370,140 | 2/1968 | Betts | 200/51.1 |
| 3,566,190 | 2/1971 | Huebner | 361/394 |
| 4,015,093 | 3/1977 | Cote | 200/51.1 |
| 4,070,557 | 1/1978 | Ostapovitch | 200/51.1 |

*Primary Examiner*—David Smith, Jr.
*Attorney, Agent, or Firm*—Arnold J. Ericsen

[57] ABSTRACT

A protective package for use with a printed circuit board having mounted thereon at least one semiconductive device susceptible to deleterious effects of variance of potential across the terminals of the device or the presence of static electric discharges. The package provides, in one embodiment, a single piece, insulating case supporting and enclosing the entire circuit board and its components and a shorting member having integrally formed, spring biased contact fingers in normal engagement with the termination pads of the board. The contact fingers are separable from engagement with the termination pads upon insertion of the circuit board into an edge connector. Another illustrated embodiment provides a holder or support for a shorting member which may enclose only a portion of a printed circuit board and only a portion including termination pads.

11 Claims, 8 Drawing Figures

STATIC CONTROL DEVICE FOR PRINTED CIRCUIT PACKAGE

BACKGROUND OF THE INVENTION

This invention relates to an improved means for protecting semiconductor devices and, particularly, logic devices which have been premounted on printed circuit boards, from the effects of static electrical charges or other phenomena causing differences in potential across exposed terminals of the board.

The need for protection of semiconductor devices, such as MOS and C-MOS integrated circuits, from the deleterious effects of static electrical charges has long been recognized. A discussion of the matter may be found in a publication of the Solid State Division of RCA entitled, "Digital Integrated Circuits, Application Note ICAN-6000" and subtitled, "Handling and Operating Considerations for MOS Integrated circuits" by S. Dansky and R. E. Funk. Further, U.S. Pat. No. 4,019,094 granted to Dinger et al on Apr. 19, 1977 describes in detail the problems involved and provides a solution in the form of a clip assembly for attachment to individual semiconductor packages. The clip assembly electrically short circuits the leads of the package and thereby prevents the buildup of a static charge on the active elements of the semiconductor which might cause damage thereto.

Other examples illustrative of means for protecting semiconductor devices per se are disclosed in U.S. Pat. Nos. 3,648,108 granted to R. J. Bailey, 3,653,498 granted to T. W. Kisor, 3,746,157 granted to T. C. I'Anson, 3,774,075 granted to A. L. Medesha and 3,908,153 granted to G. C. Cason, Jr.

The shorting clips or devices disclosed in the cited prior art are intended to be resiliently maintained in positive registration with the semiconductor package, thus leaving the lower ends of the package leads, such as for DIP packages, free in order that the clip may remain on the package throughout normal handling and assembly operations prior to insertion and soldering the leads in respective apertures of a printed circuit board.

The deleterious effects of static electrical charges upon semiconductor devices continue to be a problem even after the semiconductor devices are permanently attached to the boards. That is, physical contact by a worker whose body has accumulated a static charge may, in all likelihood, damage one or more of the devices mounted on an unprotected printed circuit board just as in the cases of the package per se. In the matter of printed circuit boards, it will be apparent that these boards are designed to be inserted and replaced in connecting receptacles, such as edge board connectors or the like. The present invention contemplates the provision of continuity of protection for the various semiconductor devices mounted on a respective board before being inserted in and after it has been removed from the connecting receptacle.

SUMMARY OF THE INVENTION

The invention, in particular, resides in a packaging means for supporting and protecting semiconductor devices, such as MOS or C-MOS integrated circuit devices, susceptible to deleterious effects when exposed to static electrical charges. This protective means comprises, in one embodiment, an assembly including a printed circuit board having mounted thereon the aforementioned semiconductor device, and which board is secured to an insulating protective cover member being spaced from and enclosing the semiconductor device. The cover member also includes a conducting terminal shorting member which is normally mechanically and electrically in engagement with the termination pads of the printed circuit board. The shorting member includes, in its preferred embodiment, a plurality of spaced apart resilient contact fingers which are biased towards engagement with respective termination pads of the printed circuit board. The contact fingers are preferably formed to include a reversely bent portion at their respective distal end portions to provide a means of slidably engaging the outer surface of an edge connector during insertion of the printed circuit board, and be concurrently disengaged from the respective termination pads.

The cover member, or case, may be molded from a single piece and formed with an integral hinge, in order that opposite side members may be folded towards one another and fastened to the printed circuit board.

Edge connectors utilized in the present invention are of conventional design and are adapted for support and electrical connection to a so-called "mother board".

It is, therefore, an object of the present invention to provide a means for protecting one or more semiconductor devices or packages after they have been mounted on an otherwise unprotected printed circuit board.

A specific object of this invention is to provide a shorting bar having integrally formed, resilient conducting fingers in normal mechanical and electrical engagement with respective termination pads of a printed circuit board, and which fingers are concurrently removed from said engagement as the board is inserted into a receptacle, such as an edge board connector.

DETAILED DESCRIPTION OF PREFERRED EMBODIMENTS

Figure 2:
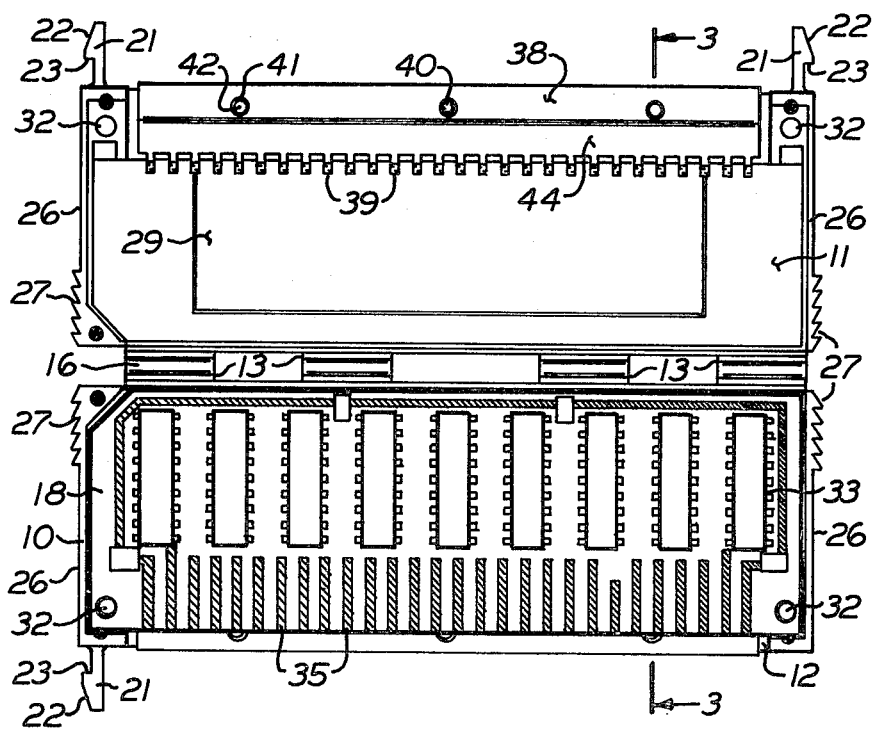
FIG. 2 is a plan view of the protective package of the present invention, wherein the cover member is illustrated prior to being folded down on integrally formed hinge portions for securing the cover member to an enclosed printed circuit board.
Figure 3:
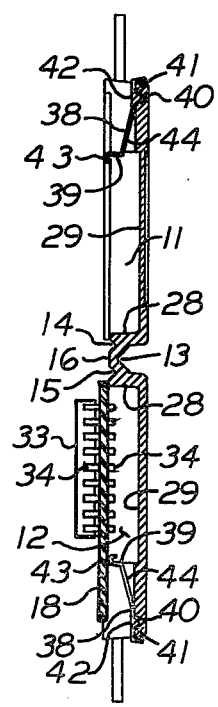
FIG. 3 is a cross-sectional view taken along lines 3—3 of FIG. 2.

With reference to the various drawings, it will be observed that a completed assembly in accordance with one embodiment of this present invention preferably comprises a one-piece case, or cover member, indicated generally by the reference numeral 10. The cover member 10, as shown in FIGS. 2 and 3, comprises oppositely disposed sidewalls 11 and 12 joined by an integrally molded hinge portion 13. The longitudinally spaced hinge portions 13 are each defined by two spaced apart, parallel longitudinal grooves 14 and 15 (see FIG. 3). The cross section of each of the grooves 14 and 15 is preferably triangular to define an intermediate hinge surface 16, which preferably has a width substantially the same as, or slightly less than, the width of a printed circuit board 18 for purposes hereinafter discussed. The cover member 10 is preferably made of "Nylon 151" material which is readily obtainable, provides both flexibility and strength, and is inexpensive to purchase. Other moldable insulating materials such as polyethylene and polypropylene can also be used.

It will be further observed that an area 20 is provided in sidewall 11 to permit insertion in the molding die of a blank to form a window (not shown). The area 20 may be, if desired, used to receive an insert molded from clear acrylic plastic, or other material capable of passing ultraviolet light rays. It is well-known that many semiconductor logic devices, such as PROM's may have their logic erased upon exposure to ultraviolet light.

Figure 1:
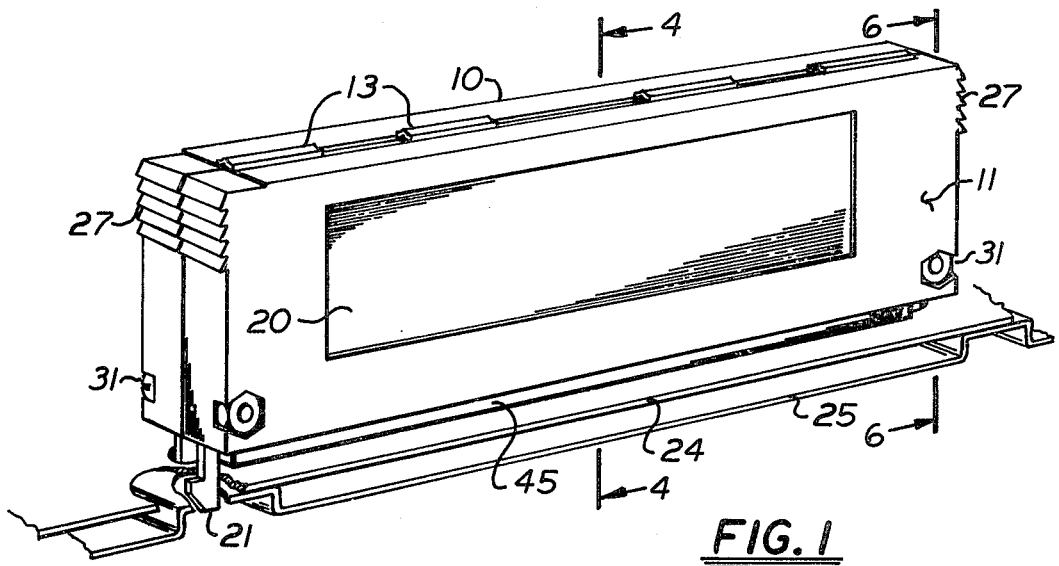
FIG. 1 is a perspective view of the complete assembly of one embodiment of the present invention shown positioned in place relative to an edge connector.

Again, with reference to FIGS. 1-3, inclusive, the case, or cover member 10, is further provided with laterally extending integral feet 21 molded at opposite corners of the respective sidewalls 11 and 12. Each of the feet 21 is provided with a cam surface 22 and a shoulder 23, the latter providing a detent for locking the assembled unit in place in a respective opening of a "mother board" 24, as will hereinafter be further discussed. The mother board 24 is further supported on a metallic rack 25 in accordance with usual practice.

For convenience in handling and inserting the packaged assembly, opposite end walls 26 are provided with integrally formed "barb-like" surfaces 27. The end walls 26 and top surfaces 28 define oppositely disposed cavities 29 arranged to receive a conventionally formed printed circuit board 30 therebetween. As previously discussed, when the sidewalls 11 and 12 are folded together along the hinge portions 13, the intermediate surface 16 of the hinge portions 13, being of substantially the same or very slightly less dimension than the thickness of the printed circuit board 30, will permit the board to be clamped between the uppermost portions of the sidewalls 11 and 12.

Figure 6:
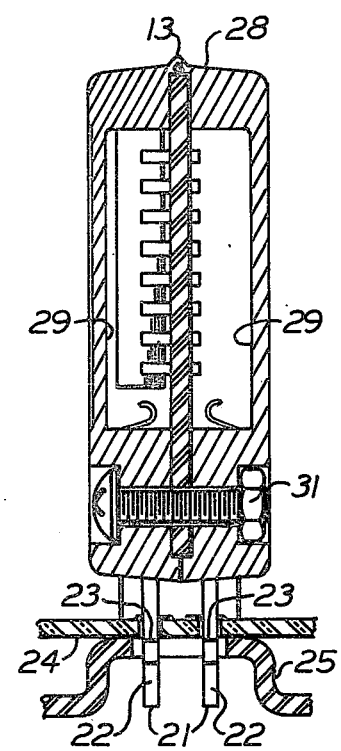
FIG. 6 is a cross-sectional view taken along lines 6—6 of FIG. 1.

The printed circuit board 30 may be retained in place by means of nut and bolt assemblies 31 which also serve to hold the two sidewalls 11 and 12 together when folded along the hinge portions 13 (see FIG. 6).

As stated previously, the assembly of the present invention has particular application in the retention and protection of printed circuit boards bearing semiconductor members, such as RAM memory segments made from MOS or C-MOS integrated circuits, and generally indicated by the reference numerals 33. Other semiconductor devices subject to damage, loss of memory, or other deleterious effects in the presence of electrostatic charges, may be protected by the packaging concept of the present invention.

In the present embodiment, it will be noted that the memory segments 33 are each assembled to the printed circuit board 18 in the usual fashion; for instance, by means of DIP (dual-in-line) packaging with terminals 34 protruding through preformed conducting apertures (not shown) in the circuit board. As a means of illustration, it will be noted that the printed circuit board 18 includes a conventional array of spaced apart parallel termination pads 35 extending from one or both sides of the lower edge of the printed circuit board 18 as viewed relative to FIGS. 1-6, inclusive.

The present invention contemplates, in addition to the novel insulating case 10, the provision of a pair of conducting terminal shorting members on at least one of the sidewalls 11 and 12, and indicated generally by the reference numeral 38. As shown in the present embodiment, two such members are mounted in the proximity of the outer surfaces of each of the sidewalls 11 and 12 of the cover member 10. The members 38 are substantially coextensive wih the length of the cover member 10. The printed circuit board 18 may be conventionally printed with conducting paths at opposite sides arranged to be soldered to the inwardly extending terminals 34 of the segments 33 and which connect with termination pads or tabs 35 at the lower edge of one or both sides of the printed circuit board 18.

The shorting bar 38 is comprised of a metal stamping including a plurality of longitudinally spaced, integrally formed resilient contact fingers 39. The fingers 39 provide the resilient conducting portion of the shorting member 38, and are arranged for spring bias towards normal mechanical and electrical engagement with respective termination pads 35 on the printed circuit board. The termination pads 35 and the contact fingers 39 are longitudinally spaced in accordance with the usual accepted printed circuit board spacing standards.

The shorting member 38 is preferably fastened to the respective sidewalls 11 and 12 of the case 10 by means of providing a plurality of spaced apart apertures 40, which are pierced and formed with an outwardly extending dimpled area 41 for reception of inwardly projecting, preformed protuberances 42 (see FIGS. 2 and 3) integrally formed during molding of the case or cover member 10. The distal end of each of the protuberances 42 projects through the respective openings 40 and is "heat staked" or otherwise sealed into place in the dimpled area 41. Other means for fastening the shorting members 38 to the sidewalls 11 and 12 may also be used. For instance, rivets, screws, etc. (not shown) inserted in apertures in the sidewalls 11 and 12 may be used to retain the members 38.

It will be further observed that the distal end portion of each of the contact fingers 39 is provided with a reverse bend at 43 providing smooth surface for contact with termination pads 35 and a cam portion 44 for sliding engagement with a receptacle, such as an edge connector, indicated generally by reference numeral 45.

Figure 4:
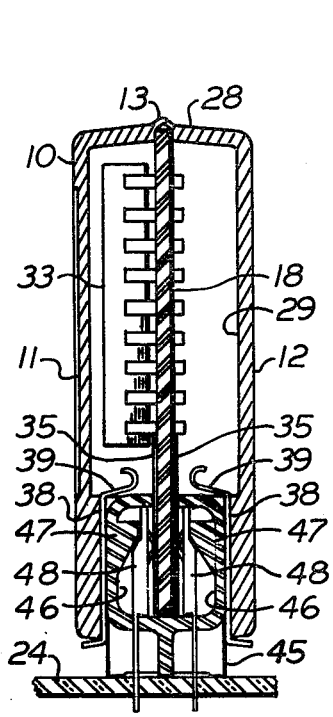
FIG. 4 is a cross-sectional view taken along lines 4—4 of FIG. 1 and showing the assembly with the enclosed printed circuit board fully inserted in an edge connector.
Figure 5:
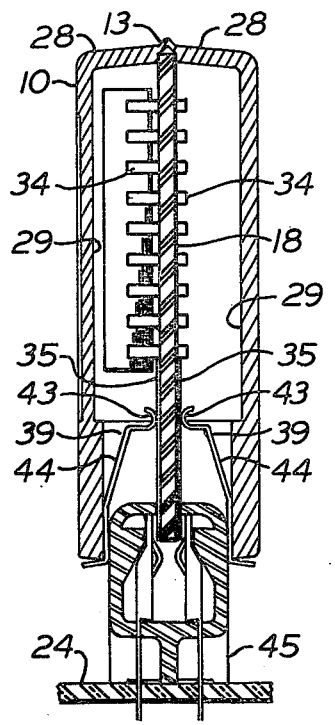
FIG. 5 is a view taken along the same plane as the view of FIG. 4, but illustrating the position of the contact fingers of the shorting bar prior to insertion of the printed circuit board in the edge connector.

With particular reference to FIGS. 4-6, inclusive, it will be observed that the edge connector 45, although not itself a part of the present invention, is of conventional construction and the salient features of which may be observed with reference to FIGS. 4 and 5. The connector 45 is preferably formed of plastic molding material including a coextensive, longitudinally arranged cavity 46 defined by the opposed integral sidewalls 47 of the connector 45. The upstanding sidewalls 47 are open at the top to receive the printed circuit board 18 inserted therebetween and having its termination pads 35 arranged for sliding mechanical contact with connector terminal members 48. The connector terminals 48 protrude through the bottom of the edge connector 45, and are each engageable with conducting openings in the "mother board" 24. Although not illustrated in detail, the mother board construction is conventional and includes a plurality of printed circuit paths for electrical and mechanical engagement with the protruding edge connector terminals 48.

It will be further observed that the conducting shorting member 38 has its respective contact fingers 39 in normally closed electrical engagement with the respective termination pads 35 on the printed circuit board 18. As will be observed from FIG. 4, when the entire assembly is seated in operating position on the edge connector 45, the upper reversely bent portions 43 of the respective contact fingers 38 will be forced by means of cam portion 44 towards the respective sidewalls 11 and 12, thus separating the contact fingers 39 from their respective termination pads 35. Normal input and output signals may be then fed to the array of memory segments 33 as desired.

It will be observed with reference to FIG. 5 that as the assembly including the cover member 10 and printed circuit board 18 is withdrawn from engagement with the edge connector 45, the normally inwardly biased resilient contact fingers 39 will be permitted to bend inwardly to permit mechanical and electrical engagement between the respective termination pads 35 and the reverse bent portions 43. In such case, inasmuch as each of the contact fingers 39 is an integral part of the shorting member or bar 38, they will provide a means of establishing equal potential across each of the respective contacting termination pads 35 of the printed circuit board 18. As such, there will be no opportunity for any extraneous static discharge or variance in voltages to be impressed on termination pads 35 connected to the input/output leads of the memory segments 33 to cause damage to any device in any of the respective logic circuits of the respective memory segments 33. The insulating cover member or case 10, acting in concert with the shorting member 38, will also prevent contact by the respective segments 33 with any adjacent device or other object which might potentially discharge static electricity to cause other deleterious effects to the semiconductor device.

It will be apparent that the assembly of the present embodiment provides an inexpensive and convenient method of protecting memory arrays and other semiconductor devices which are subject to deleterious effects upon exposure to electrostatic charges or differences in potential. In addition, although the packaging is illustrative of a double sidewall, hinged unit, it is within the province of this invention to utilize a construction wherein only one side of the printed circuit board 18 need be protected. Thus, the package could effectively operate with only one cover member either comprising sidewall 11 or sidewall 12, assuming that the opposite side of the printed circuit board is provided with an insulating conformal coating or other means of protecting the board.

Figure 7:
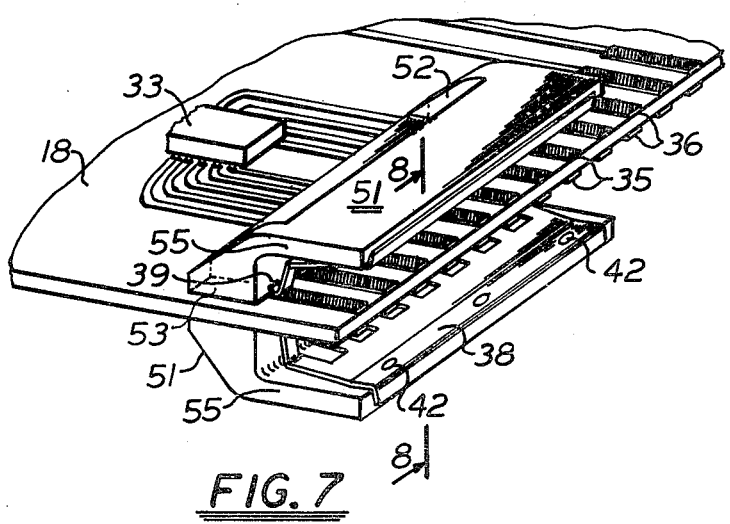
FIG. 7 is a perspective view of another embodiment of this invention, wherein there is disclosed an assembly comprising two identical members, each including shorting members and each secured to opposite sides of a printed circuit board, but covering only the termination pads on only a portion of the board.
Figure 8:
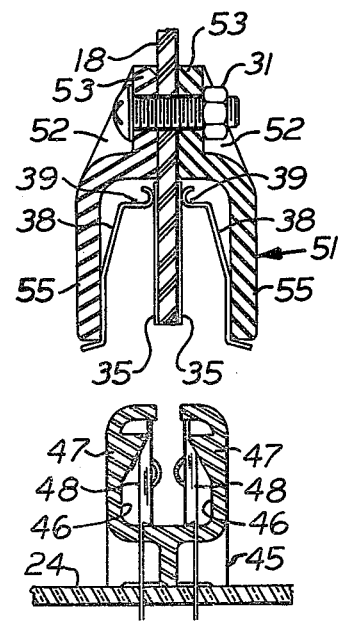
FIG. 8 is a sectional view taken along lines 8—8 of FIG. 7, and further showing the relationship of the assembly of FIG. 7 with a typical edge connector adapted to receive and support the assembly.

Attention is now directed to the views of FIGS. 7 and 8 which are illustrative of another embodiment of the present invention. For purposes of clarity, the same reference numerals will be used on like parts comprising the assembly of both illustrated embodiments.

In the present embodiment, a holder or support member 51, molded of plastic material, is of a general "Z" cross-sectional configuration strengthened at opposite ends by means of the integrally molded webs 52. As shown, the holders 51 are mounted at opposite sides of a printed circuit board 18 and secured to the board by means of the nut and bolt assembly 31 extending through apertures in a base portion 53 and in the circuit board 18. The sidewall 55 of each of the holders 51 is spaced from the printed circuit board 18 and arranged to support the shorting member 38 in the same manner as previously described in connection with the embodiment of FIGS. 1-6, inclusive. That is, the shorting member 38 is fastened to the respective sidewall 55 by heat staking a protuberance 42, or by other known fastening means. The resilient contact fingers 39 of the shorting member 38 normally contact the termination pads 35 connected to the input/output leads of the memory segments 33.

It will be apparent from FIG. 7 that the holder 51 for a respective shorting member 38 may be of any desirable length that permits its contact fingers 39 to contact only those termination pads 35 leading to memory segments 33 which require protection. It is assumed, for purposes of discussion, that the termination pads 36 are connected to other devices on the printed circuit board 18 (not shown) which do not require protection from deleterious static electrical discharges.

As shown in FIG. 8, the assembly, comprising the oppositely disposed holders 51 secured to the printed circuit board 18, is arranged to be seated within the cavity 46 of and electrically connected to the terminals 48 in the edge connector 45.

It will be apparent that, although a pair of holders 51 is shown disposed at opposite sides of the board 18, at times only one member 51 may be needed to protect termination pads on only one side of a board 18 (not shown). It is obvious that the embodiment of FIGS. 7 and 8 is used where the added protection for the memory segments 33 provided by the cover member 10 of the first described embodiment illustrated in FIGS. 1-6, inclusive, is not needed. Also, it will be apparent that in both preferred embodiments, the contact fingers 39 may be joined together to provide a non-interrupted, resilient surface portion (not shown). The non-interrupted portion, like the spaced apart contact fingers 39, will normally contact the pads 35 and be formed to disengage the pads 35 upon insertion of the board in its edge connector.

The foregoing description of the present invention is only illustrative of exemplary forms which the invention may take. Still other modifications and variations may suggest themselves to persons skilled in the art. It is intended, therefore, that the foregoing detailed description be considered as exemplary only in that the scope of the invention be ascertained from the following claims.

The embodiments of the invention in which an exclusive property or privilege is claimed are defined as follows:

1. A lead shorting device for a printed circuit board having mounted thereon at least one semiconductor element having terminals electrically engaging conducting circuit paths on said board, said paths terminating in spaced apart, conducting termination pads, and wherein said circuit board is removably insertable in an elongated connector device having contacts arranged for electrical engagement with respective ones of said termination pads and an insulating housing at least partially surrounding said contacts, said housing defining an exposed camming surface, and wherein said semiconductor device is susceptible to deleterious effects in the presence of a difference in potential across its terminals prior to insertion of said board into said connector device, said lead shorting device including:

an insulating support member adapted for attachment to said circuit board and extending across the termination pads electrically connected to said semiconductor element; and a conducting terminal shorting member supported by said support member including a plurality of integral, resilient conducting portions arranged for normal engagement with and electrically shorting each of the respective termination pads electrically connected to the semiconductor device, the resilient conducting portions of said shorting member each having cam follower means cooperating with the camming surface of the housing of said connector device for separating said portion from said termination pads upon insertion of said circuit board into said connector device.

2. The invention in accordance with claim 1, wherein the said insulating support member is elongated and has a base for attachment to said circuit board and an integral sidewall portion spaced from said termination pads, and wherein said conducting shorting member is attached to said sidewall portion.

3. The invention in accordance with claim 1, wherein the said insulating support member comprises a cover member molded of insulating material and further including an enclosing wall surface defining a cavity for receiving and covering the semiconductor element, the conducting circuit paths engaging the terminals of said element and the said termination pads.

4. The invention in accordance with claim 1, wherein the said insulating support member is of a molded unitized construction comprising two sidewalls joined by an integral longitudinal hinge portion, said hinge portion being configured to provide an intermediate relatively flat surface and oppositely disposed grooves, whereby when said sidewalls of said cover member are folded together with one edge of said circuit board abutting said flat surface, said circuit board will be clamped between said sidewall members at said hinge portion.

5. The invention in accordance with claim 1, wherein the semiconductor device is an integrated circuit memory logic component.

6. The invention in accordance with claim 1, wherein said conducting shorting member comprises a metallic stamping including a base portion fastened to the sidewall of said support member, said resilient conducting portion comprising a plurality of spaced apart contact fingers extending laterally from said base portion and in normally closed engagement with respective ones of said termination pads, said contact fingers being further configured for sliding engagement with the camming surface of the housing of said connector device to provide said means for separation of said fingers from the respective termination pads upon insertion of said circuit board into said connector device.

7. The invention in accordance with claim 4, wherein said circuit board includes spaced apart termination pads on opposite sides of said board, and wherein a conducting shorting member is provided for engagement with the oppositely disposed termination pads and comprises a pair of metallic stampings, each having a portion fastened to a respective sidewall of said cover member, said resilient conducting portion comprising a plurality of spaced apart contact fingers extending laterally from the respective base portions of each of said stampings and in normally closed engagement with respective ones of said termination pads, said contact fingers being further configured for sliding engagement with the camming surface of the housing of said connector device to provide said means for separation of said fingers from the respective termination pads upon insertion of said circuit board into said connector device.

8. The invention in accordance with claim 6, wherein each of said contact fingers is provided with a camming surface for sliding engagement with said connector device during insertion and removal of said circuit board relative to said connector device.

9. The invention of claim 4, wherein said sidewalls include inwardly depending surfaces defining respective cavities for receiving said printed circuit board and devices mounted thereon and to provide a means of spacing said sidewalls from said board and devices.

10. The invention of claim 4, wherein releasable fastening means are provided to hold said folded sidewalls together and to further secure said circuit board between said sidewalls.

11. The invention of claim 3, wherein said enclosing wall surface includes a window portion of a material capable of transmitting ultraviolet light to said semiconductor element, and wherein said semiconductor element includes a logic memory erasable in the presence of ultraviolet light.

* * * * *